United States Patent
Yi et al.

(10) Patent No.: US 9,190,305 B2
(45) Date of Patent: Nov. 17, 2015

(54) SYSTEM AND METHOD FOR MANAGING INFORMATION ABOUT WAFER CARRIER IN BUFFER

(75) Inventors: Hyun Jae Yi, Suwon-si (KR); Byung Soo Park, Hwaseong-si (KR); Sang Hyuk Park, Hwaseong-si (KR); In Cheol Kim, Suwon-si (KR); Chang Soo Lee, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 161 days.

(21) Appl. No.: 13/417,471

(22) Filed: Mar. 12, 2012

(65) Prior Publication Data
US 2012/0235793 A1    Sep. 20, 2012

(30) Foreign Application Priority Data
Mar. 15, 2011    (KR) .................. 10-2011-0022976

(51) Int. Cl.
*H04Q 5/22*    (2006.01)
*H01L 21/67*    (2006.01)

(52) U.S. Cl.
CPC .............................. *H01L 21/67294* (2013.01)

(58) Field of Classification Search
USPC .......................... 340/10.1–10.5, 572.1–572.9
See application file for complete search history.

(56) References Cited

U.S. PATENT DOCUMENTS

| | | | |
|---|---|---|---|
| 6,330,971 B1 * | 12/2001 | Mabry et al. ................... | 235/383 |
| 2008/0030341 A1 * | 2/2008 | Zhuang ....................... | 340/572.7 |
| 2008/0236755 A1 * | 10/2008 | Kondoh et al. ........... | 156/345.51 |
| 2008/0240896 A1 * | 10/2008 | Lo et al. .................... | 414/416.03 |
| 2010/0214078 A1 * | 8/2010 | Chen et al. .................... | 340/10.5 |

\* cited by examiner

*Primary Examiner* — Ojiako Nwugo
(74) *Attorney, Agent, or Firm* — Harness, Dickey & Pierce, P.L.C.

(57) ABSTRACT

The wafer carrier information management system includes a reader unit for reading wafer carrier information from a transmitting/receiving unit attached to a wafer carrier in a buffer, and a reader unit controller for collecting the wafer carrier information from the reader unit. The system may further include a buffer controller for collecting the wafer carrier information from the reader unit controller, and a wafer manager for receiving the wafer carrier information from the buffer controller.

18 Claims, 10 Drawing Sheets

SYSTEM AND METHOD FOR MANAGING INFORMATION ABOUT WAFER CARRIER IN BUFFER

This application claims priority under 35 U.S.C. §119 to Korean Patent Application No. 10-2011-0022976, filed on Mar. 15, 2011, in the Korean Intellectual Property Office, the disclosure of which is incorporated herein in its entirety by reference.

BACKGROUND

1. Field

Example embodiment relate to a wafer carrier information management system and/or method for collecting information about wafer carriers and reporting the information to a higher system in a semiconductor processing line.

2. Description of the Related Art

With the recent introduction of an automatic physical distribution management system to semiconductor processing, wafers are conveyed and loaded using an auto guided vehicle, a laser guided vehicle, an overhead hoist transport (OHT), etc.

Buffers are arranged at the side of a path through which a wafer transferring vehicle is moved to temporarily store wafer carriers while the wafer transferring vehicle transfers wafer carriers. If the position of a buffer and a wafer carrier loaded in the buffer can be recognized, the operation of the wafer transferring vehicle can be efficiently managed when the wafer transferring vehicle loads a new wafer carrier in a buffer or conveys a wafer carrier loaded in a buffer. Furthermore, information about wafer carriers loaded in buffers helps in management of semiconductor processing.

A conventional wafer carrier information management method collects information about a wafer carrier loaded in a buffer and manages the collected information by recognizing the wafer carrier information from a transmitting/receiving unit attached to the wafer carrier while a wafer transferring vehicle unloads/loads the wafer carrier from/to the buffer because a system for collecting and managing the wafer carrier information is not provided to the buffer. FIG. 1 illustrates a conventional wafer carrier information management system using an OHT 30 as a wafer transferring vehicle. The OHT 30 loads a wafer carrier 20 in a buffer 10 or unloads a wafer carrier loaded in the buffer 10 while moving along a rail 31. The OHT 30 reads information about the wafer carrier 20 loaded in the buffer 10 while loading/unloading the wafer carrier 20 in/from the buffer 10 and transmits the read information to an OHT controller 32 that is a higher system of the OHT 30. The OHT controller 32 transmits the wafer carrier information to a wafer manager 40 of a semiconductor processing line such that the wafer manager 40 collects the information about the wafer carrier 20 in the buffer 10 and stores the information in a database.

As described above, when the wafer manager 40 of the semiconductor processing line manages wafer carrier information in the database, if the database has an error since system power is cut off or the system has trouble, an operator manually inputs data in order to recover the database or eliminate the wafer carrier from the buffer.

Furthermore, when the wafer carrier information is managed through the aforementioned method, it is difficult to acquire information about a wafer carrier loaded in a specific buffer in the semiconductor processing line. This makes wafer carrier management difficult.

SUMMARY

At least one embodiment provides a wafer carrier information management system and/or method in which a buffer collects information about a wafer carrier loaded in the buffer and directly transmits the information to a wafer manager of a semiconductor processing line such that the wafer carrier information can be easily recovered when an error is generated in a database of the wafer manager.

At least one embodiment provides a wafer carrier information management system and method for collecting and transmitting information about a wafer carrier in a buffer in real time to verify the reliability of wafer carrier information in a database managed by a wafer manager.

In one embodiment, a wafer carrier information management system includes one or more reader units each configured to read information about a wafer carrier, loaded in a buffer corresponding thereto, from a transmitting/receiving unit attached to the wafer carrier; and at least one reader unit controller configured to receive wafer carrier information read by at least one of the reader units and store the received information.

The wafer carrier information management system may further include a load sensor associated with at least one buffer and configured to sense whether a wafer carrier is loaded in the associated buffer.

When the load sensor senses the wafer carrier loaded in the buffer, the read unit corresponding to the buffer may be configured to read wafer carrier information from a transmitting/receiving unit attached to the wafer carrier loaded in the buffer.

The reader unit controller may be configured to receive wafer carrier information stored in the one or more reader units from the reader units.

The wafer carrier information management system may further include a buffer controller configured to receive wafer carrier information stored in the reader unit controller and store the received wafer carrier information.

The wafer carrier information management system may further include a wafer manager configured to receive wafer carrier information stored in the reader unit controller, store the received wafer carrier information in a database, and manage the database.

The wafer carrier information management system may further include a wafer manager configured to receive the wafer carrier information stored in the buffer controller, store the wafer carrier information in a database, and manage the database.

The reader unit controller may be configured to periodically receive and store wafer carrier information stored in the at least one reader unit.

The buffer controller may be configured to periodically receive and store wafer carrier information stored in each reader unit controller.

The wafer carrier may be a front open unified pod (FOUP).

The transmitting/receiving unit attached to the wafer carrier may be an RFID tag using a radio frequency (RF) and each of the reader units may be an RFID reader configured to receive information from the RFID tag through RF communication.

In another embodiment, a wafer carrier information management method includes reading information about a wafer carrier loaded in a buffer from a transmitting/receiving unit attached to the wafer carrier using a reader unit corresponding to the buffer from among one or more reader units, and collecting the read information from the one or more reader units and transmitting the collected information to a wafer manager.

The collecting and transmitting may include enabling one or more reader unit controllers that control the one or more read units to collect the read information from the one or more reader units and transmit the collected information to the wafer manager.

The collecting and transmitting may include enabling one or more reader unit controllers that control the reader units to collect the read information from the one or more reader units; enabling a buffer controller that controls the one or more reader unit controllers to collect the collected information from the one or more reader unit controllers; and transmitting the collected information collected by the buffer controller to the wafer manager.

The one or more reader unit controllers or the buffer controller may periodically collect wafer carrier information stored in the reader units.

The wafer carrier information management method may further include storing the transmitted information from the buffer controller in a database by the wafer manager.

The wafer carrier information management method may further include verifying reliability of the database of the wafer manager using the transmitted information.

When information about a wafer carrier loaded in a buffer in a semiconductor processing line is managed using the wafer carrier information management system method, the buffer directly collects the information about the wafer carrier loaded therein and reports the collected information to the wafer manager corresponding to a higher system, and thus even when an error is generated in the database of the wafer manager, the database can be rapidly recovered using the wafer carrier information reported by the buffer.

In addition, since information about a wafer carrier loaded in each buffer can be acquired in real time, the reliability of the database of the wafer manager can be verified and information about a wafer carrier in a buffer located in a specific section in the semiconductor processing line can be easily acquired.

BRIEF DESCRIPTION OF THE DRAWINGS

These and/or other aspects of the example embodiments will become apparent and more readily appreciated from the following description of the embodiments, taken in conjunction with the accompanying drawings of which.

DETAILED DESCRIPTION

Figure 1:
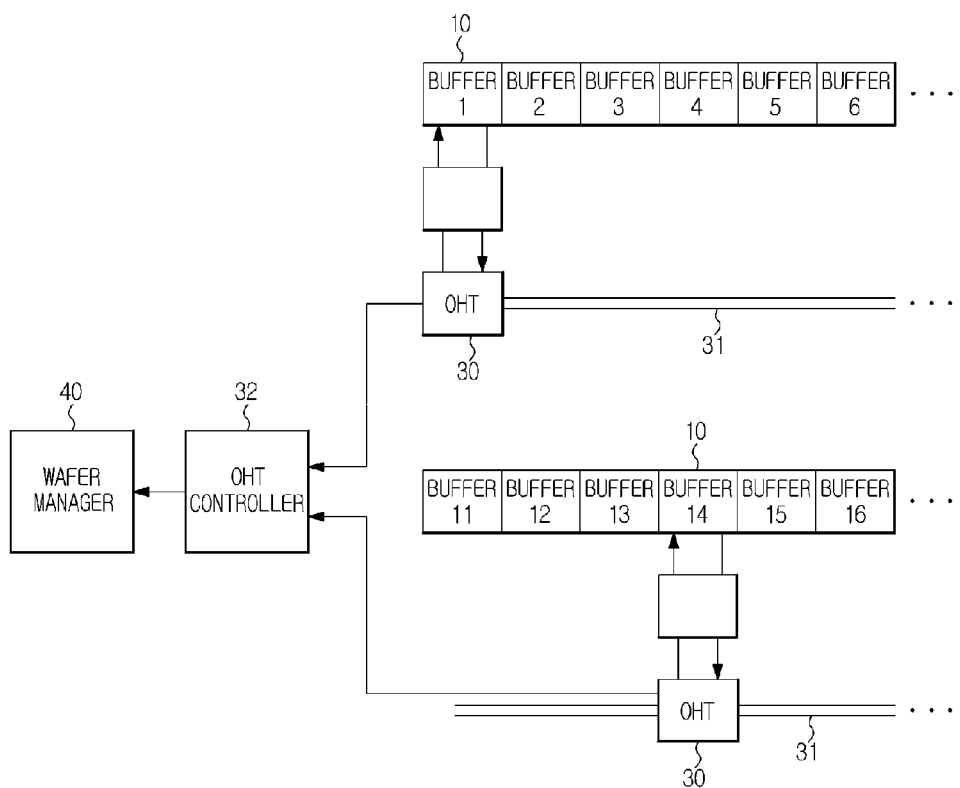
FIG. 1 illustrates a conventional method of collecting information about a wafer carrier loaded in a buffer.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
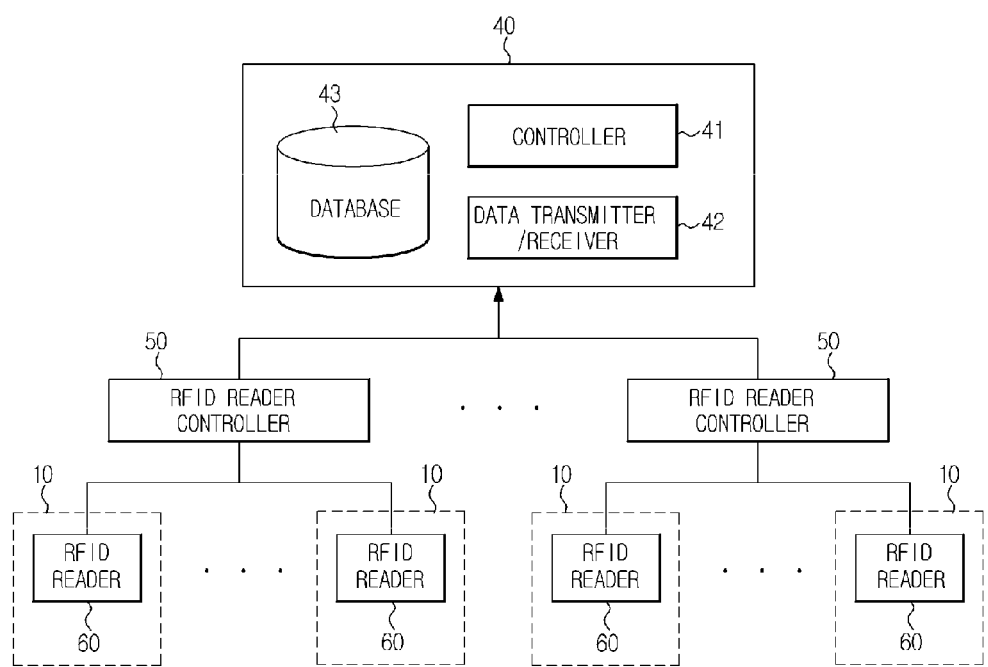
FIG. 2 is a block diagram of a wafer carrier information management system according to an embodiment.

Referring to FIG. 2, the wafer carrier information management system according to one example embodiment includes one or more reader units 60 each of which reads information about a wafer carrier 20 (shown in FIG. 5) loaded in a corresponding buffer 10. Each reader unit 60 reads the information from a transmitting/receiving unit 21 attached to the wafer carrier 20 and stores the read wafer carrier information. The system further includes a reader unit controller 50 that collects the wafer carrier information from the one or more reader units 60.

The buffers 10 are arranged at the side of a path through which a wafer transferring vehicle is moved. Each buffer 10 is a space for temporarily loading and storing the wafer carrier 20 while the wafer transferring vehicle transfers the wafer carrier 20 for subsequent processes.

The example embodiment may use a container of any type that receives and carries a wafer as the wafer carrier 20, such as a front open shipping box (FOSB), a front open unified pod (FOUP), a wafer cassette, etc. The FOUP is an antistatic wafer carrier used to transfer chips between processes in a fabrication facility (FAB) in which semiconductor processing is performed. The FOUP is mainly used in current semiconductor processing due to its long service life since it is used only inside the FAB, distinguished from the FOSB, and its antistatic and anti-surface resistance properties. An embodiment, which uses the FOUP as the wafer carrier, will now be described.

Recently, radio frequency identification (RFID) has been used to transmit and receive information on a wafer accommodated in a wafer carrier. The RFID automatically recognizes an object having an electronic tag attached thereto when the object enters a recognition area of a reader and reads information about the object using a radio frequency. The RFID does not require an additional operation of bringing the reader into direct contact with a microchip or scanning the microchip using the reader to read data stored in the microchip and has an advantage of transmission of a large quantity of data. An RFID system includes an electronic tag that is attached to an object and contains detailed information about the object, an RFID reader that receives information of the electronic tag through RF communication, and an information server that collects information from the RFID reader to construct a database.

The reader unit and the transmitting/receiving unit used in the example embodiment may have any configuration so long as the configurations can exchange information with each other, the transmitting/receiving unit uses an RFID tag, the reader unit uses an RFID reader, and the reader unit controller uses an RFID reader controller in the following description.

In addition, examples of transferring vehicles that can be used in the example embodiments include an auto guided vehicle, a laser guided vehicle, an OHT, etc. An OHT that moves along a rail attached to a ceiling is used in the following embodiments.

FIG. 2 is a block diagram of a wafer carrier information management system according to an embodiment. Referring to FIG. 2, the RFID reader 60 is included in each buffer 10, reads information about an FOUP loaded in the corresponding buffer 10 from an RFID tag attached to the FOUP and stores the read information. The RFID reader controller 50 collects information about FOUPs, stored in one or more RFID readers 60, and stores the collected information. For example, one RFID reader controller 50 is installed per bay of a semiconductor processing line to collect FOUP information from a plurality of RFID readers 60 in one bay and stores the collected information. The FOUP information stored in the RFID reader controller 50 is transmitted to a wafer manager 40, stored in a database 43 of the wafer manager 40, and used for semiconductor processing control. The wafer manager 40 can have any configuration so long as it can collect and manage wafer carrier information. The wafer manager 40 can be connected to a host computer that transmits, receives and processes data while controlling the overall semiconductor manufacturing process through a network to be related with the existing processing control communication system.

Figure 3:
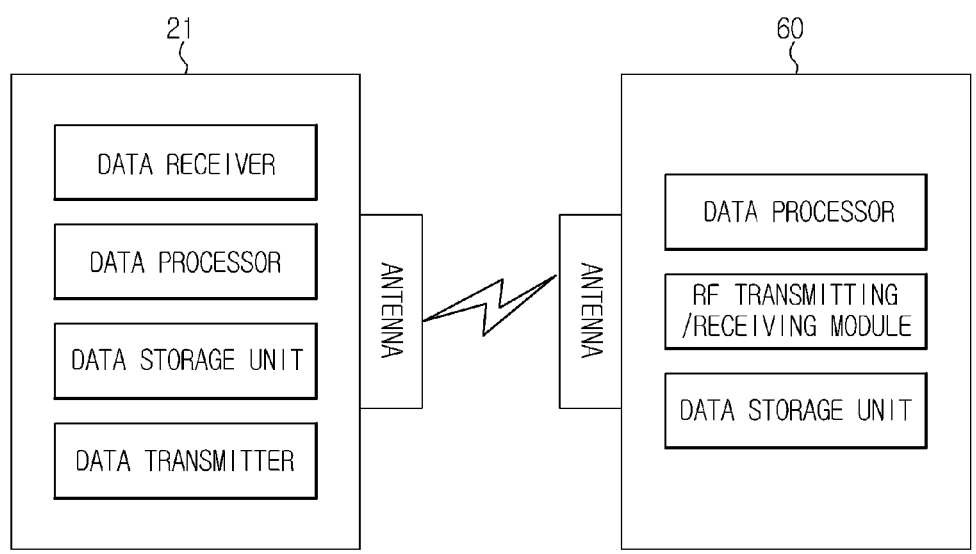
FIG. 3 is a block diagram showing internal configurations of an RFID tag and an RFID reader.

FIG. 3 is a block diagram showing internal configurations of an RFID tag 21 used as the transmitting/receiving unit and the RFID reader 60 used as the reader unit. The RFID tag 21 includes a data storage unit for storing information about a wafer carrier to which the RFID tag 21 is attached. The information may include, for example, the position of the wafer carrier, the number of wafers accommodated in the wafer carrier, processed states of the accommodated wafers, the internal temperature of the wafer carrier, etc. The RFID tags 21 further includes a data processor for handling the stored information, a data receiver for receiving the information about the wafer carrier, a data transmitter for transmitting the information about the wafer carrier, and an antenna for transmitting/receiving RF signals. The RFID reader 60 includes an RF transmitting/receiving module for transmitting/receiving the information about the wafer carrier or frequency information to/from the RFID tag 21, a data storage unit for storing received information, a data processor for analyzing a signal transmitted from the RFID tag 21, and an antenna for transmitting/receiving RF signals to/from the RFID tag 21.

According to an embodiment, the RFID tag 21 and the RFID reader 60 transmit and receive information about the FOUP 20 through the antennas. The RFID tag 21 transmits and receives RF signals in a desired (or, alternatively a predetermined) frequency band through the antenna thereof. The data receiver of the RFID tag 21 converts an RF signal corresponding to data about the FOUP 20, received through the antenna, to a digital signal, and transmits the digital signal to the data processor. The data processor analyzes the data about the FOUP 20, received from the data receiver, and stores the analysis result in the data storage unit. The data transmitter converts the data stored in the data storage unit into an analog signal and transmits the analog signal to the antenna. The antenna of the RFID reader 60 receives the analog signal transmitted in the form of an RF signal from the RF tag 21, and the RF transmitting/receiving module converts the analog signal to a digital signal. The data processor of the RFID reader 60 analyzes the digital signal and stores the analysis result corresponding to the information about the FOUP 20 in the data storage unit of the RFID unit 60. The information about the FOUP 20, stored in the data storage unit of the RFID reader 60, is transmitted to the RFID reader controller 50 through another communication.

The wafer carrier information management system according to an embodiment may further include a load sensor 11 (shown in FIG. 7) that senses whether the FOUP 20 is loaded in the buffer 10 for efficient operation of the RFID reader 60. The load sensor 11 is included in the buffer 10. The RFID reader 60 operates only when the load sensor senses the FOUP 20 loaded in the buffer 10 to read information about the FOUP 20 from the RFID tag 21 attached to the FOUP 20 and store the read information.

As described above, FOUP information collected and stored by the RFID reader controller 50 may be directly transmitted to the wafer manager 40. Alternatively, the FOUP information is preferably transmitted to the wafer manager 40 via a buffer controller 70 that collects and manages information about FOUPs loaded in all the buffers in the semiconductor processing line for more systematic information management.

Figure 4:
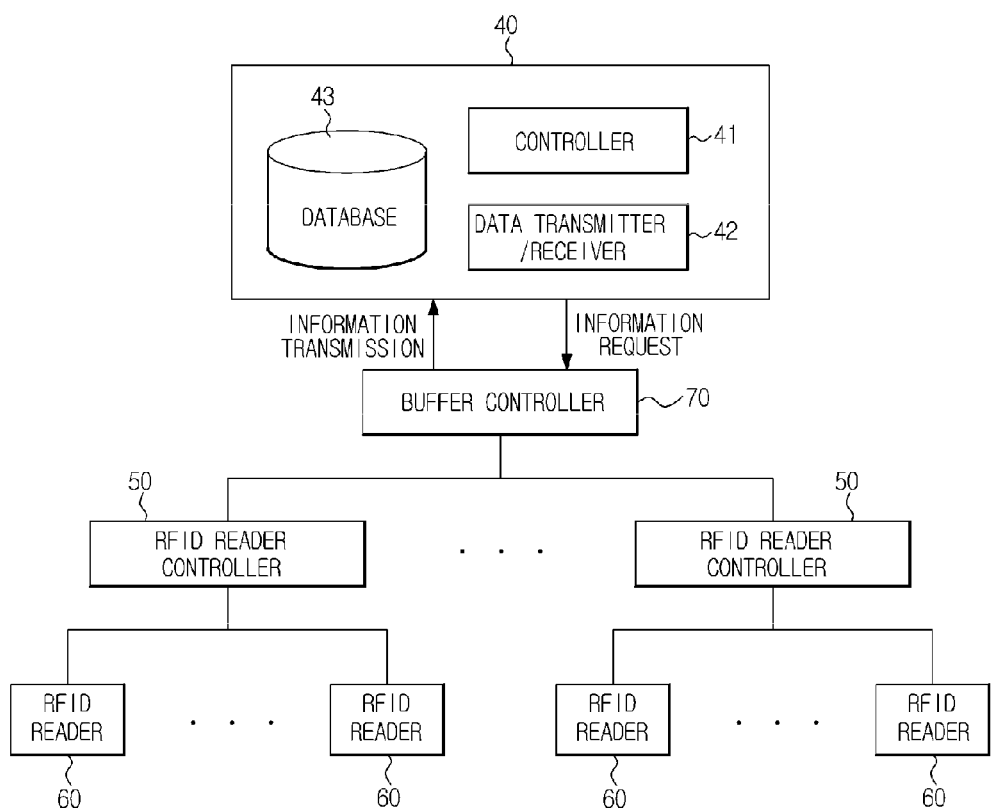
FIG. 4 is a block diagram of a wafer carrier information management system including a buffer controller.

FIG. 4 is a block diagram of a wafer carrier information management system including the buffer controller 70 according to an embodiment. As described above, when the RFID reader controller 50 is provided to each bay in the semiconductor processing line, as many RFID reader controllers 50 as the number of bays are present. The RFID reader controller 50 collects, from the RFID readers 60 in the bay corresponding thereto, information about FOUPs loaded in the buffers corresponding to the RFID readers 60, stores the collected FOUP information, and transmits the FOUP information to the buffer controller 70. The RFID readers 60 can communicate with the RFID reader controller 50 in a wireless or wired manner. The buffer controller 70 receives FOUP information from each RFID reader controller 50 and transmits the FOUP information to the wafer manager 40. The buffer controller 70 may transmit the FOUP information to the wafer manager 40 at the request of the wafer manager 40. Alternatively, the buffer controller 70 may transmit the FOUP information to the wafer manager 40 in real time irrespective of the request of the wafer manager 40. When the RFID reader controller 50 directly transmits wafer carrier information to the wafer manager 40, an intermediate system is not necessary thereby achieving cost reduction. However, the wafer manager 40 communicates with all the RFID reader controllers in the semiconductor processing line so that a load may be applied to the wafer manager 40. Accordingly, it is determined whether to add the buffer controller 70 to the system in consideration of the scale of the semiconductor processing line. However, it may be desirable to add the buffer controller 70 to the system such that the buffer controller 70 and the wafer manager 40 can communicate with each other in a recent large-scale semiconductor processing line.

Figure 5:
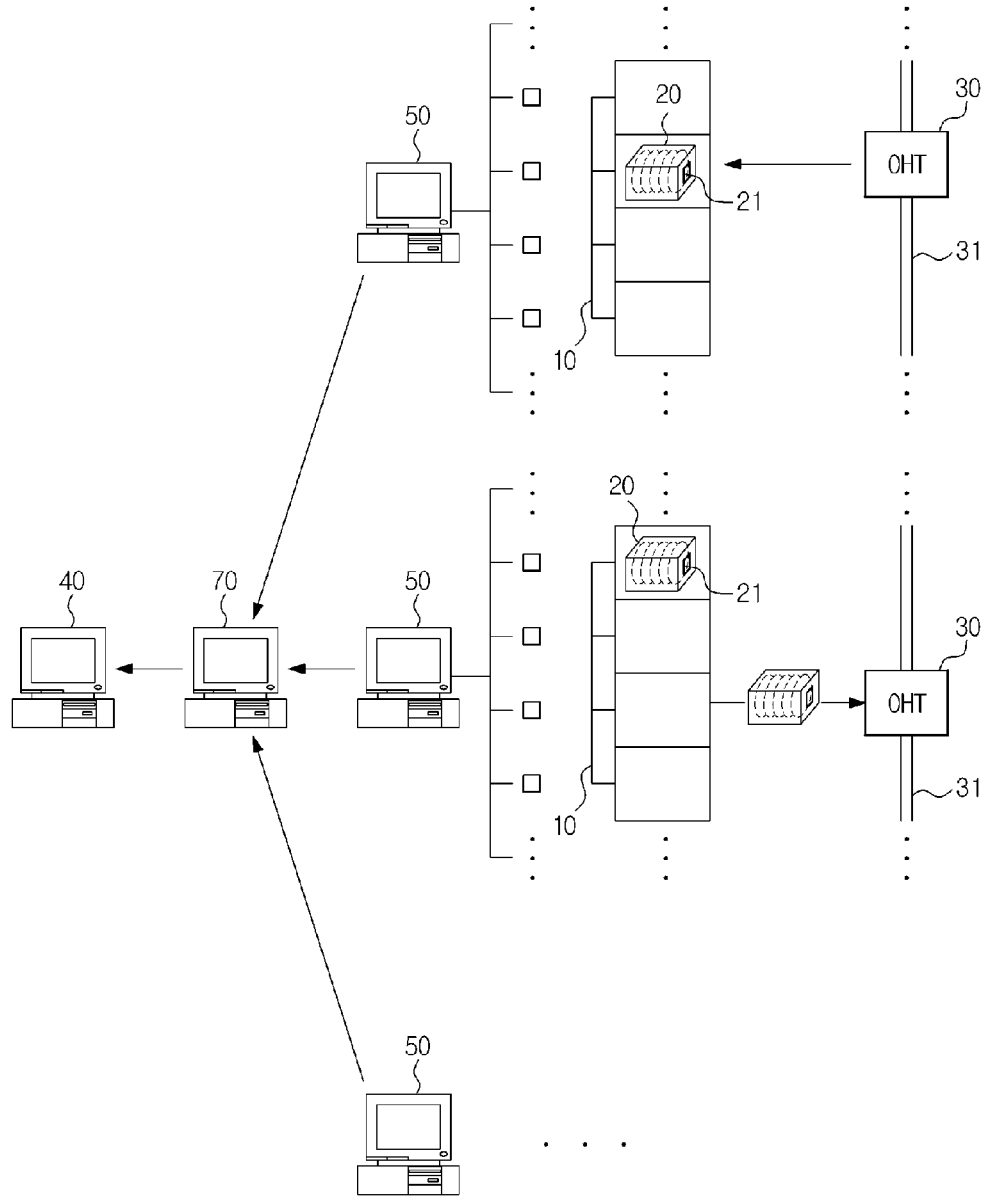
FIG. 5 illustrates a configuration of a semiconductor processing line in which the wafer carrier information management system according to an embodiment is used.

FIG. 5 illustrates a configuration of a semiconductor processing line in which the wafer carrier information management system of an example embodiment is used. As described above, the buffers 10 are arranged at the side of the rail 31 on which the OFT 30 is moved in the semiconductor processing line such that the FOUPs 20 can be loaded in the buffers 10 while the OHT 30 transfers the FOUPs 20 for efficient transfer, loading and unloading operations of the OHT 30. Any configuration can replace the buffer 10 so long as it can execute the above-described function. The OHT 30 can unload the FOUPs 20 to the buffers 10 while moving and transferring the FOUPs 20 after completing another task. The RFID readers 60 corresponding to the buffers 10 read information about the FOUPs 20, from the RFID tags 21 attached to the FOUPs 20 loaded in the buffers 10 and stores the read information. The RFID reader 60 can be located inside or outside the corresponding buffer 10 so long as it can transmit/receive RF signals to/from the RFID tag 21 attached to the FOUP 20 without interfering with obstacles. FOUP information stored in each RFID reader 60 is transmitted to the RFID reader controller 50. As many RFID reader controllers 50 as the number of bays of the semiconductor processing line are present when one RFID reader controller 50 is installed per bay, and the RFID readers 60 in a bay transmit FOUP information stored therein to the RFID reader controller 50 corresponding to the bay. This is merely an example and the RFID reader controller 50 can be provided as various units. The FOUP information transmitted to the RFID reader controller 50 may be directly transmitted to the wafer manager 40 or delivered to the wafer manager 40 via the buffer controller 70.

Figure 6:
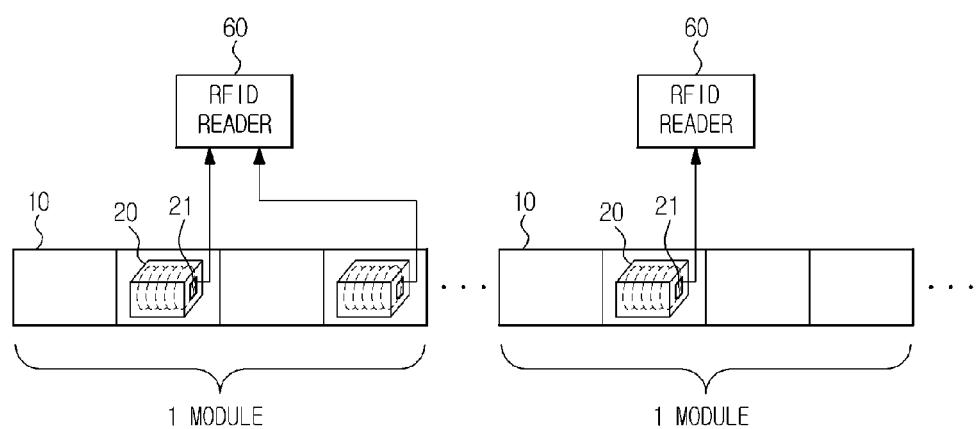
FIG. 6 illustrates a wafer carrier information management system having modules each including four buffers.

While the RFID reader 60 can be included in each buffer, the RFID reader 60 may be provided to a module including a plurality of buffers to reduce semiconductor processing cost. FIG. 6 illustrates a wafer carrier information management system including modules each having four buffers 10. The RFID reader 60 is provided to each module to read information about FOUPs 20 loaded in the four buffers 10 of each module from the RFID tags 21 attached to the FOUPs 20 and stores the read information. Since the RFID can transmit a large amount of information, it is possible to increase the number of buffers corresponding to each module. The process of transmitting FOUP information from the RFID reader 60 to the wafer manager 40 in this embodiment is identical to the process of the aforementioned embodiment in which the RFID reader 60 is provided to each buffer.

Figure 7:
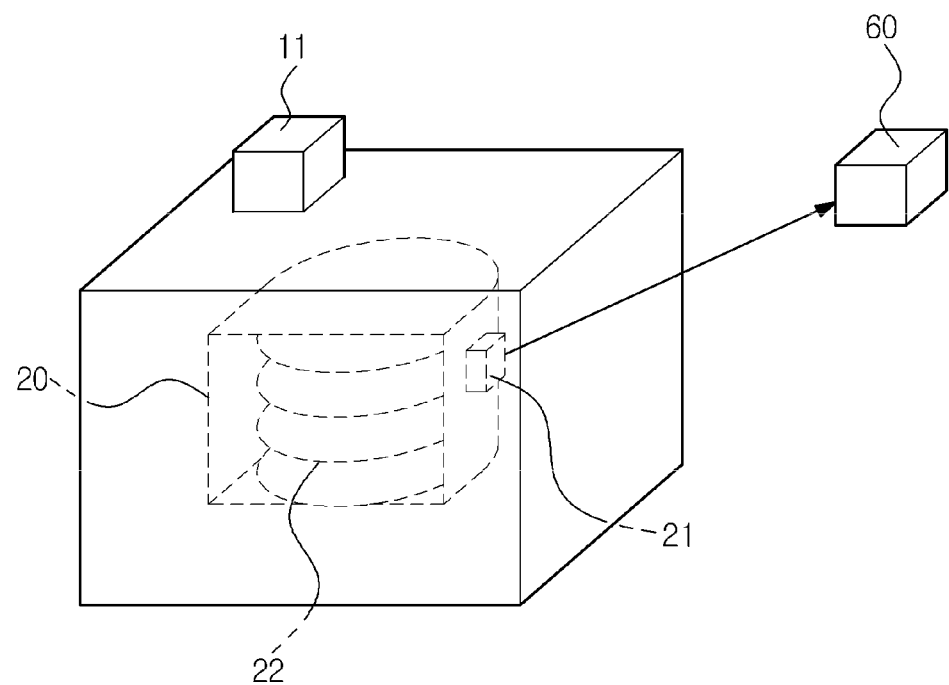
FIG. 7 illustrates an internal configuration of a buffer in which a wafer carrier is loaded.

FIG. 7 illustrates the internal configuration of the buffer 10 when the RFID reader 60 is provided to each buffer. The load sensor 11 senses whether an FOUP is loaded in the buffer. When the load sensor 11 senses the FOUP, the RFID reader 60 operates to read information about the FOUP from the RFID tag 21 attached to the FOUP and store the read information. The load sensor 11 can be located in any position in the buffer, such as the top, bottom or side of the buffer, so long as it can sense the presence or absence of the FOUP 20 in the buffer. The information about the FOUP may be information regarding the FOUP 20, such as the number of wafers 22 accommodated in the FOUP 20, the internal temperature of the FOUP 20, processed states of the wafers 22 accommodated in the FOUP 20, and the position of the FOUP 20.

When the RFID reader controller 50 collects FOUP information read from the RFID tags 21 attached to the FOUPs 20 and directly transmits the collected FOUP information to the wafer manager 40 or delivers it to the wafer manager 40 via the buffer controller 70, a new database can be constructed using the transmitted FOUP information when the FOUP database stored in the wafer manager 40 has an error.

The RFID reader controller 50 and the buffer controller 70 can periodically collect FOUP information. The wafer manager 40 can determine whether the database stored therein is reliable using real-time FOUP information transmitted from the RFID reader controller 50 or the buffer controller 70.

A wafer carrier information management method according to another embodiment will now be described with reference to the attached drawings.

The wafer carrier information management method according to an embodiment includes a step of reading wafer carrier information from a transmitting/receiving unit attached to a wafer carrier loaded in a buffer using a reader unit and storing the read wafer carrier information, and a step of collecting wafer carrier information stored in the reader unit and transmitting the collected wafer carrier information to the wafer manager 40.

As in the aforementioned wafer carrier information management system, the wafer carrier information management method according to an embodiment will be described on the assumption that the transmitting/receiving unit is an RFID tag, the reader unit is an RFID reader, the wafer carrier is an FOUP, and the wafer transferring vehicle is an OHT.

Figure 8:
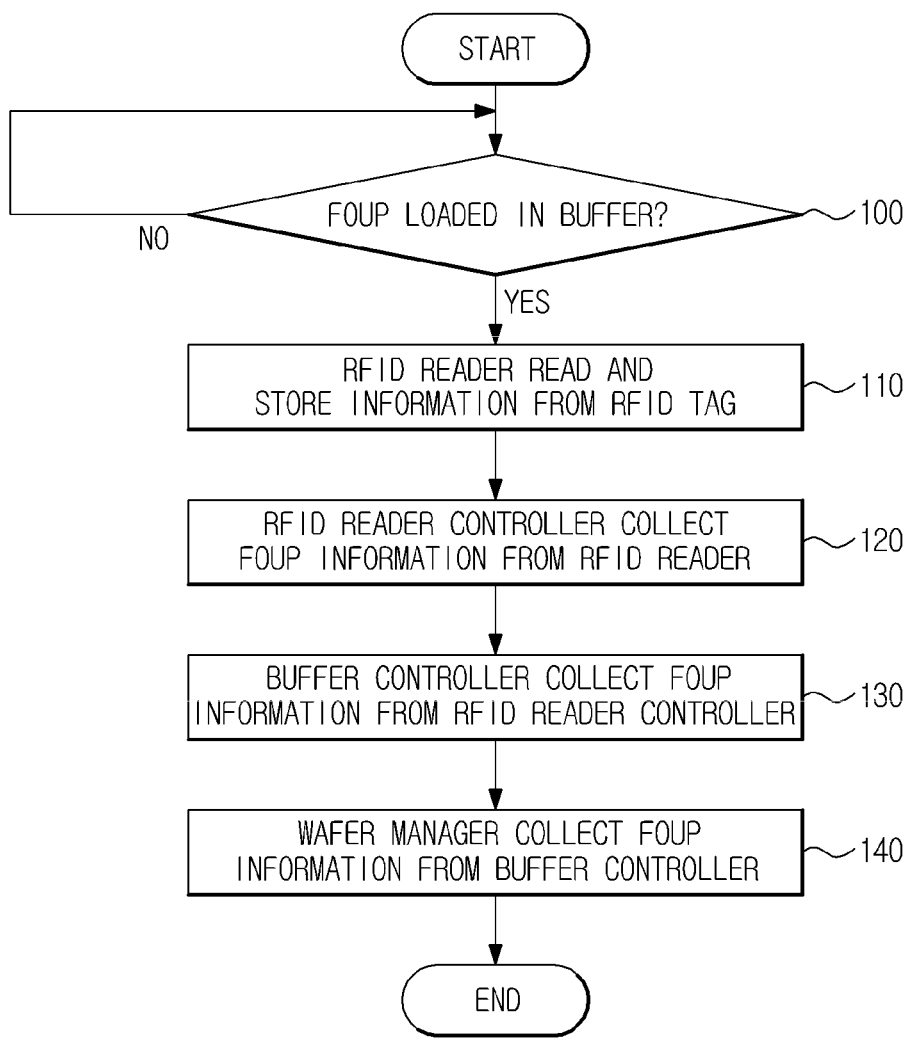
FIG. 8 is a flowchart illustrating a wafer carrier information management method according to an embodiment.

FIG. 8 is a flowchart illustrating the wafer carrier information management method according to an embodiment. A load sensor attached to each buffer senses whether an FOUP is loaded in the buffer and, when the load sensor senses the FOUP ('YES' of 100), the RFID reader reads information about the FOUP loaded in the buffer from an RFID tag attached to the FOUP and stores the read information (110). Here, the information about the FOUP can be information, such as the number of wafers accommodated in the FOUP, the internal temperature of the FOUP, processed states of the wafers accommodated in the FOUP, the position of the FOUP, etc. While the RFID reader can be provided to each buffer, it is also possible to provide the RFID reader to a module including a plurality of buffers to reduce semiconductor processing cost. As described above, the RFID can transmit a large quantity of information, and thus it is possible to configure a module with a plurality of buffers. At this time, the size of the module is determined in consideration of information transfer capacity. FOUP information stored in each RFID reader is transmitted to the RFID reader controller and collected by the RFID reader controller (120). For example, the RFID reader controller can be provided to each bay of the semiconductor processing line. The RFID reader controller receives FOUP information from a plurality of RFID readers in the bay corresponding thereto and stores the received FOUP information. The number of RFID readers, controlled by the RFID reader controller, can be determined by a user in consideration of management efficiency.

While the RFID reader controller can directly transmit FOUP information to the wafer manager, the RFID reader controller may send the FOUP information to the wafer manager via the buffer controller that collects information about FOUPs loaded in all the buffers. The RFID reader controller in charge of each module, for example, a bay of the semiconductor processing line, transmits FOUP information collected from RFID readers in the bay to the buffer controller (130). The buffer controller 130 transmits FOUP information received from one or more RFID reader controllers to the wafer manager (140).

Figure 9:
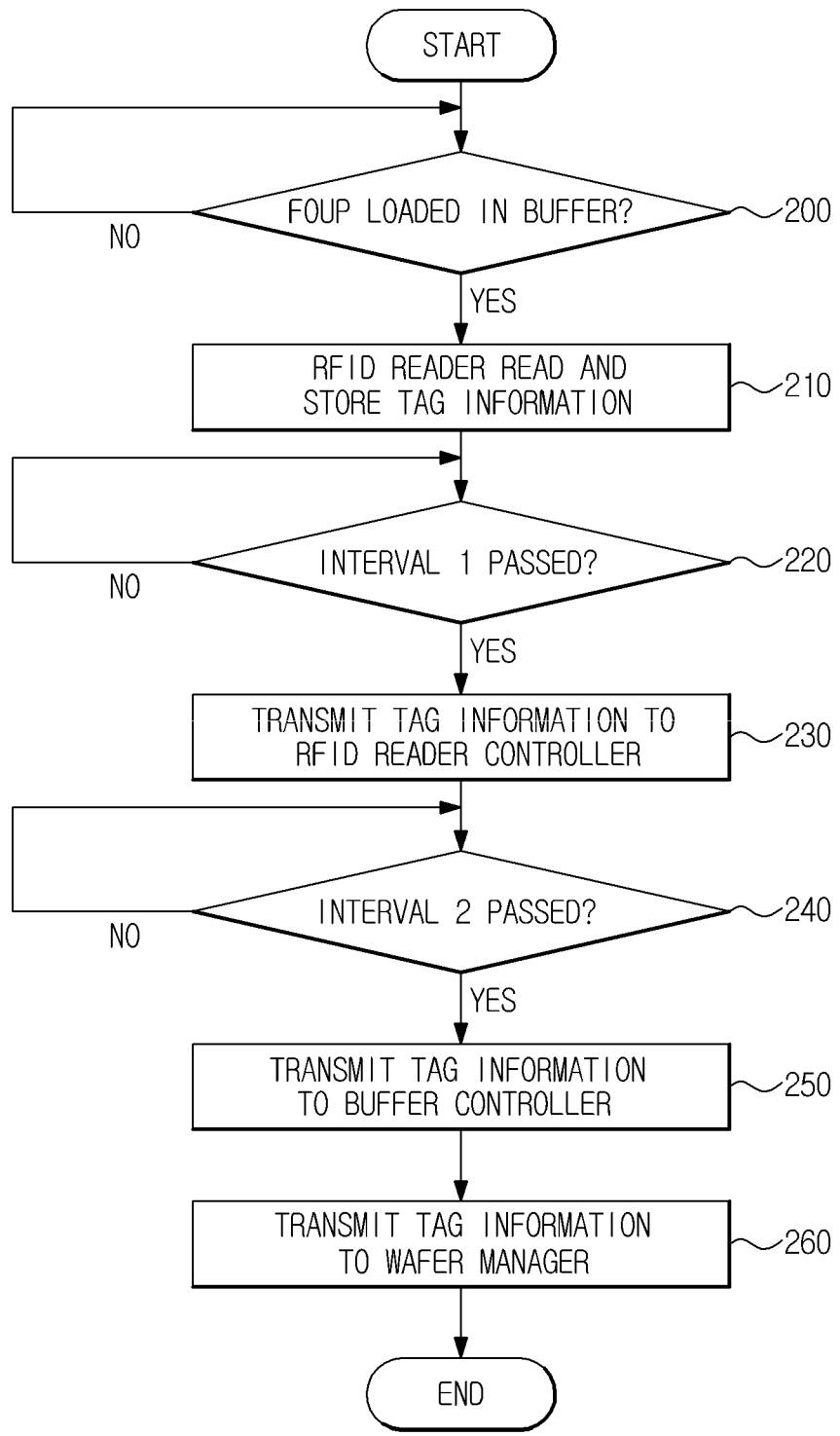
FIG. 9 is a flowchart illustrating a wafer carrier information management method for periodically collecting wafer carrier information.

The RFID reader controller and the buffer controller periodically collect FOUP information. FIG. 9 is a flowchart illustrating a wafer carrier information management method for periodically collecting FOUP information. When the load sensor in a buffer senses an FOUP loaded in the buffer ('YES' of 200), the RFID reader corresponding to the buffer reads information about the FOUP from an RFID tag attached to the FOUP and stores the read information (210). After a desired (or, alternatively a predetermined) lapse of time corresponding to interval 1 ('YES' of 220), the RFID reader controller collects FOUP information from RFID readers belonging to a module corresponding to the RFID reader controller and stores the collected FOUP information (230). After a desired (or, alternatively a predetermined) lapse of time corresponding to interval 2 ('YES' of 240), the buffer controller collects FOUP information from all RFID reader controllers and stores the collected FOUP information (250). The interval 1 and interval 2 may be equal to or different from each other. The FOUP information stored in the buffer controller is transmitted to the wafer manager (260) and used for semiconductor processing control. If the interval of collecting FOUP information is short, the wafer manager can recognize states of FOUPs loaded in buffers in real time using the FOUP information received from the RFID reader controllers or the buffer controller. Furthermore, when the FOUP information database stored in the wafer manager has an error, the wafer manager unit can rapidly recover the database using the real-time FOUP information.

In addition, the real-time FOUP information can be compared with the database information stored in the wafer manager to check whether the database information is correct or whether an error is generated in the database to thereby verify reliability of the database.

The interval of collecting FOUP information can be determined by the user in consideration of information management efficiency.

Figure 10:
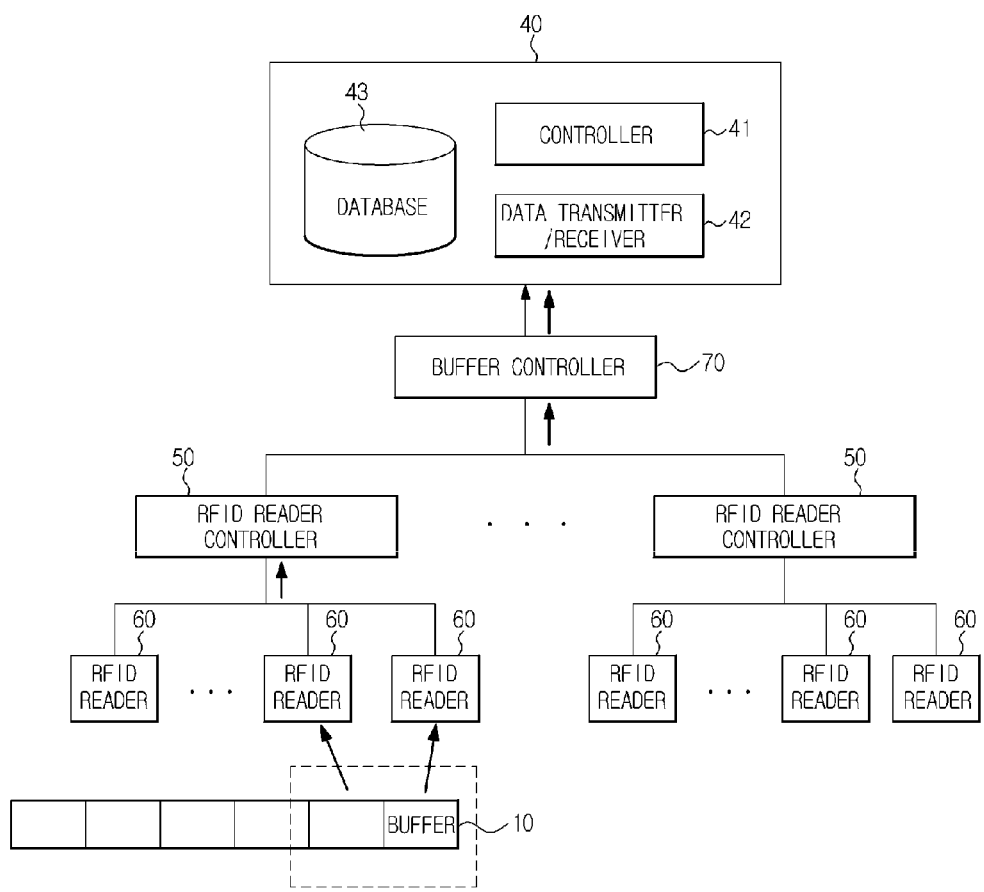
FIG. 10 is a block diagram of a wafer carrier information management system for managing information about a wafer carrier loaded in a specific buffer.

Moreover, information about a wafer carrier located in a specific buffer can be collected and managed in real time according to the wafer carrier information management system and method according to the an embodiment. FIG. 10 is a block diagram of a wafer carrier information management system for managing information about a wafer carrier loaded in a specific buffer. A user may need to know a wafer carrier loaded in a specific buffer while performing a semiconductor process. In this case, information about the wafer carrier loaded in the buffer can be transmitted in real time when the wafer carrier information management system and method of the present invention are used. Accordingly, the user can manage the information about the wafer carrier loaded in the specific buffer in real time.

Although a example embodiments have been shown and described, it would be appreciated by those skilled in the art that changes may be made in these embodiments without departing from the principles and spirit of the invention, the scope of which is defined in the claims and their equivalents.

What is claimed is:

1. A wafer carrier information management system, comprising: one or more reader units each configured to read at intervals information about a wafer carrier, the wafer carrier loaded in a buffer corresponding thereto, from a transmitting and/or receiving unit attached to the wafer carrier; and at least one reader unit controller configured to receive at intervals wafer carrier information read by at least one of the reader units and store the received wafer carrier information such that reliability of the wafer carrier information is verified using the wafer carrier information received at intervals, wherein the buffer is an area provided at a side of a path through which a wafer transferring vehicle moves, and the buffer is configured to temporarily load and store the wafer carrier out of the path.

2. The wafer carrier information management system according to claim 1, further comprising:
a load sensor associated with at least one buffer, and configured to sense whether a wafer carrier is loaded in the associated buffer.

3. The wafer carrier information management system according to claim 2, wherein the reader unit corresponding to the associated buffer reads wafer carrier information from a transmitting and/or receiving unit attached to the wafer carrier loaded in the associated buffer.

4. The wafer carrier information management system according to claim 1, further comprising:
a buffer controller configured to receive wafer carrier information stored in the reader unit controller and store the received wafer carrier information.

5. The wafer carrier information management system according to claim 4, further comprising:
a wafer manager configured to receive the wafer carrier information stored in the buffer controller, store the wafer carrier information in a database, and manage the database.

6. The wafer carrier information management system according to claim 5, wherein the reader unit controller is configured to periodically receive and store wafer carrier information stored in the at least one of the reader units.

7. The wafer carrier information management system according to claim 5, wherein the buffer controller is configured to receive at intervals and store at intervals wafer carrier information stored in the reader unit controller.

8. The wafer carrier information management system according to claim 5, wherein the wafer carrier is a front open unified pod (FOUP).

9. The wafer carrier information management system according to claim 5, wherein the transmitting and/or receiving unit attached to the wafer carrier is an RFID tag using a radio frequency (RF) and each of the reader units is an RFID reader configured to receive information from the RFID tag through RF communication.

10. The wafer carrier information management system according to claim 4, wherein the buffer controller is configured to transmit at intervals the received wafer carrier information to the wafer manager.

11. The wafer carrier information management system according to claim 1, further comprising:
a wafer manager configured to receive wafer carrier information stored in the reader unit controller, store the received wafer carrier information in a database, and manage the database.

12. The wafer carrier information management system according to claim 1, wherein the one or more reader units are grouped as one or more modules and at least one of the one or more modules includes a plurality of buffers.

13. A wafer carrier information management method, comprising: reading at intervals information about a wafer carrier loaded in a buffer from a transmitting and/or receiving unit attached to the wafer carrier using a reader unit corresponding to the buffer from among one or more reader units; and collecting at intervals the read information from the one or more reader units; and transmitting at intervals the collected information to a wafer manager, wherein the reading at intervals, collecting at intervals, and transmitting at intervals verifies reliability of the information using the information transmitted at intervals and the buffer is an area provided at a side of a path through which a wafer transferring vehicle moves, and the buffer is configured to temporarily load and store the wafer carrier out of the path.

14. The wafer carrier information management method according to claim 13, wherein the collecting at intervals and transmitting at intervals comprise enabling one or more reader unit controllers that control the one or more reader units to collect at intervals the read information from the one or more reader units and transmit at intervals the collected information to the wafer manager.

15. The wafer carrier information management method according to claim 13, wherein the collecting at intervals and transmitting at intervals comprise:

enabling one or more reader unit controllers that control the reader units to collect at intervals the read information from the one or more reader units;

enabling a buffer controller that controls the one or more reader unit controllers to collect at intervals the collected information from the one or more reader unit controllers; and transmitting at intervals the collected information collected by the buffer controller to the wafer manager.

16. The wafer carrier information management method according to claim 15, further comprising:

Storing at intervals the transmitted information from the buffer controller in a database by the wafer manager.

17. The wafer carrier information management method according to claim 16, further comprising:

verifying reliability of the database of the wafer manager using the transmitted Information.

18. The carrier information management method according to claim 17, wherein each of the reading at intervals, collecting at intervals, and transmitting at intervals is performed so that the verifying reliability recovers an error of the transmitted data stored using the collected information transmitted at intervals.

* * * * *